(12) United States Patent
Kennedy et al.

(10) Patent No.: US 6,812,131 B1
(45) Date of Patent: Nov. 2, 2004

(54) USE OF SACRIFICIAL INORGANIC DIELECTRICS FOR DUAL DAMASCENE PROCESSES UTILIZING ORGANIC INTERMETAL DIELECTRICS

(75) Inventors: Joseph Travis Kennedy, San Jose, CA (US); Henry Chung, Hsinchu (TW); Anna George, Sunnyvale, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/547,167

(22) Filed: Apr. 11, 2000

(51) Int. Cl.[7] ............................................. H01L 21/4763
(52) U.S. Cl. ........................ 438/623; 438/942; 438/624; 438/627
(58) Field of Search ................................. 438/623, 637, 438/942, 624, 622, 627, 638

(56) References Cited

U.S. PATENT DOCUMENTS

| | | | |
|---|---|---|---|
| 5,635,423 A | 6/1997 | Huang et al. | 437/195 |
| 5,686,354 A | 11/1997 | Avanzino et al. | 437/190 |
| 5,705,430 A | 1/1998 | Avanzino et al. | 437/195 |
| 5,795,823 A | 8/1998 | Avanzino et al. | 438/639 |
| 6,037,255 A * | 3/2000 | Hussein et al. | 438/675 |
| 6,228,758 B1 * | 5/2001 | Pellerin et al. | 438/624 |

* cited by examiner

Primary Examiner—Amir Zarabian
Assistant Examiner—Christy Novacek
(74) Attorney, Agent, or Firm—Bingham McCutchen; Sandra P. Thompson (57) ABSTRACT

Dual damascene methods of fabricating conducting lines and vias in organic intermetal dielectric layers utilize sacrificial inorganic dielectrics. In one embodiment, a via opening formed in organic intermetal dielectric layers is filled with sacrificial inorganic dielectric. A line opening is formed aligned with the via opening. The sacrificial inorganic dielectric is selectively removed. The via and line openings are filled with conducting material. In a second embodiment, a line opening formed in organic intermetal dielectric layers is filled with sacrificial inorganic dielectric. A via opening is formed aligned with the line opening. The sacrificial inorganic dielectric is selectively removed. The via and line openings are filled with conducting material. The sacrificial inorganic dielectrics protect the organic intermetal dielectric layers, preserving critical dimensions and facilitating photoresist rework. The sacrificial inorganic dielectrics are removed without damaging the organic intermetal dielectric layers.

27 Claims, 6 Drawing Sheets

USE OF SACRIFICIAL INORGANIC DIELECTRICS FOR DUAL DAMASCENE PROCESSES UTILIZING ORGANIC INTERMETAL DIELECTRICS

BACKGROUND OF THE INVENTION

1. Field of the Invention

The methods of the present invention relate to the fabrication of conducting vias and conducting lines for integrated circuits in semiconductor devices. More particularly, the methods of the present invention relate to the use of sacrificial inorganic dielectrics in dual damascene methods utilizing low dielectric constant organic intermetal dielectric layers.

2. Description of the Related Art

The desired characteristic feature size in integrated circuits continues to decrease. Conversely, the desired number of stacked metal interconnect and intermetal dielectric layers in integrated circuits continues to increase. These trends drive the development of new integrated circuit fabrication methods and the incorporation of new materials into integrated circuits.

In accord with these trends, damascene processes are replacing traditional subtractive etching methods as the primary metal patterning technique in integrated circuit fabrication. In traditional subtractive etching methods, a metal layer is deposited on a dielectric layer, and a photoresist layer is deposited on the metal layer. The photoresist is patterned photolithographically to correspond to the desired conductor pattern. The metal not protected by the photoresist is etched away to leave the desired conductor pattern.

In damascene methods, a pattern corresponding to the desired conductor pattern is etched into a dielectric layer. The etched pattern is filled with conductor to form the desired conductor pattern. In single damascene methods, deposition of conducting material into interconnect patterns and via patterns occurs in separate steps. In dual damascene methods, the interconnect and via patterns are filled simultaneously. Damascene methods provide reduced feature sizes compared to traditional subtractive etching methods. In addition, damascene methods can use copper as a conductor. Copper is difficult to use in subtractive processes. Dual damascene methods require fewer process steps than single damascene methods, and thus reduce fabrication costs. Dual damascene methods of integrated circuit fabrication are discussed, for example, in U.S. Pat. Nos. 5,635,423; 5,686,354; 5,705,430; and 5,795,823. Dual damascene methods include "via first" methods in which via openings are etched in a stack of dielectric layers before conducting line openings are etched, and "line first" methods in which line openings are etched before via openings are etched.

The reduced feature size in integrated circuits provided by new fabrication techniques results, in principle, in improved device performance. However, capacitive coupling between conductors increases as the distance between conductors decreases. This capacitive coupling degrades device performance.

Capacitive coupling between conductors is proportional to the dielectric constant of the material separating the conductors. Consequently, the capacitive coupling between conductors in an integrated circuit can be reduced by reducing the dielectric constant of the intermetal dielectric layers in the integrated circuit. Thus, industry desires dual damascene processes incorporating low dielectric constant materials.

Many of the low dielectric constant materials being considered for use in dual damascene integrated circuit fabrication processes are organic materials. Examples of such low dielectric constant organic materials include polyimides, polytetrafluoroethylene, parylenes, fluorinated and non fluorinated poly(arylene ethers), for example the poly(arylene ether) available under the tradename FLARE™ from Honeywell Inc., the polymeric material obtained from the phenyl-ethynylated aromatic monomer provided by Dow Chemical Company under the tradename SiLK™, and fluorinated amorphous carbon.

Unfortunately, such organic low dielectric constant materials share many chemical properties with the typically organic photoresist and sacrificial (temporary) fill materials used in dual damascene processes. Consequently, organic intermetal dielectric layers are vulnerable to damage during the photoresist and sacrificial fill stripping steps of integrated circuit fabrication and thus difficult to incorporate into dual damascene processes.

Figure 1A:
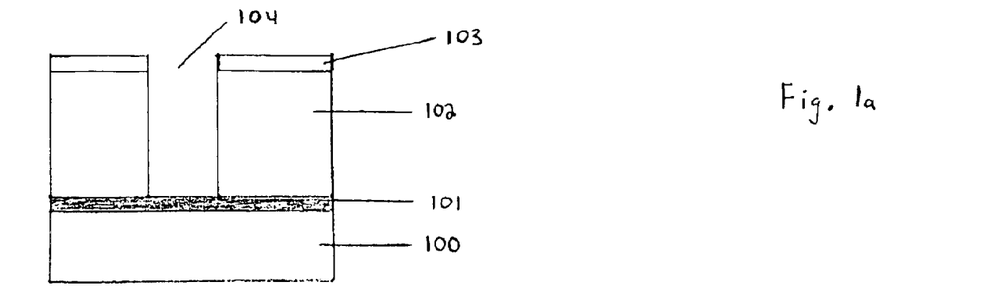
FIGS. 1a-1d illustrate a portion of the process flow of a prior art "via first" dual damascene process utilizing an organic intermetal dielectric layer and an organic sacrificial layer.

Typical problems associated with incorporating organic intermetal dielectric layers into conventional dual darnascene processes occur, for example, in the portion of the process flow for a "via first" dual damascene scheme illustrated in FIGS. 1a-1d. FIG. 1a depicts a substrate, 100, overlaid by a stack of dielectric layers including a diffusion barrier, 101, an organic intermetal dielectric layer, 102, and an inorganic hardmask layer 103. In an earlier process step, not shown, a via opening, 104, was etched into hardmask layer, 103, and organic intermetal dielectric layer, 102.

Figure 1B:
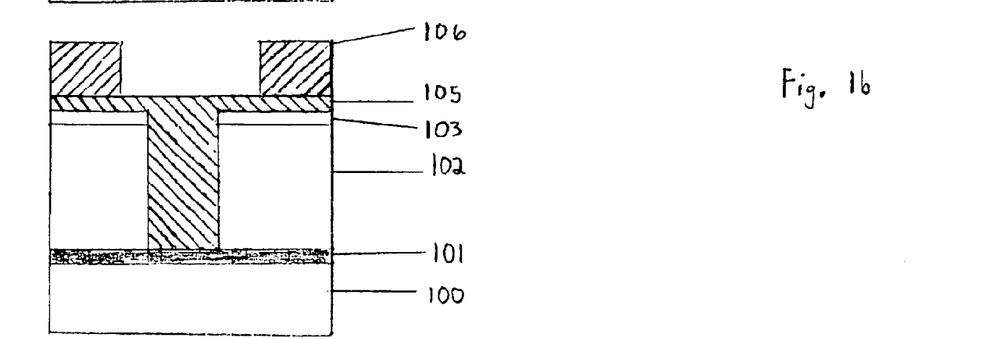

As illustrated in FIG. 1b, the via opening, 104, is filled by sacrificial fill layer, 105, which also covers hardmask layer, 103. A photoresist layer, 106, is deposited on sacrificial fill layer 105, baked, photolithographically patterned with a mask defining a desired line opening, and developed. The sacrificial fill material is typically an organic material such as a conventional photoresist material, which may or may not absorb light of the wavelength used in the photolithographic process, or organic antireflective coating (ARC). The sacrificial fill material is typically thermally crosslinked to make it resistant to the 2.5% solution of tetramethylammoniumhydroxide (TMAH) typically used to develop photoresist layer, 106.

Figure 1C:
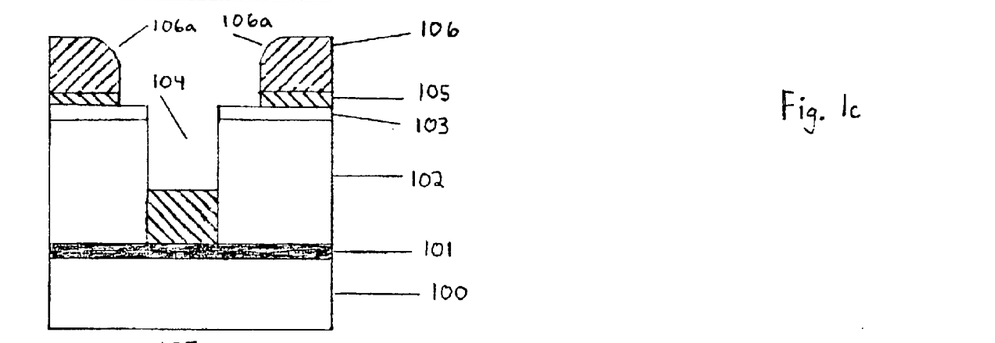

As illustrated in FIG. 1c, the portion of the sacrificial fill layer, 105, not covered by the photoresist layer, 106, is typically anisotropically etched with an oxygen based plasma to uncover a portion of inorganic hardmask layer, 103, and to reopen a portion of via opening, 104. The edges, 106a, of photoresist layer, 106, are typically rounded by the oxygen based plasma etch, which attacks the typically organic photoresist as well as the organic sacrificial material. Such rounding of the photoresist layer edges, 106a, can degrade critical dimensions in the interconnect pattern and lead to shorting and other electrical problems in the circuit.

Figure 1D:
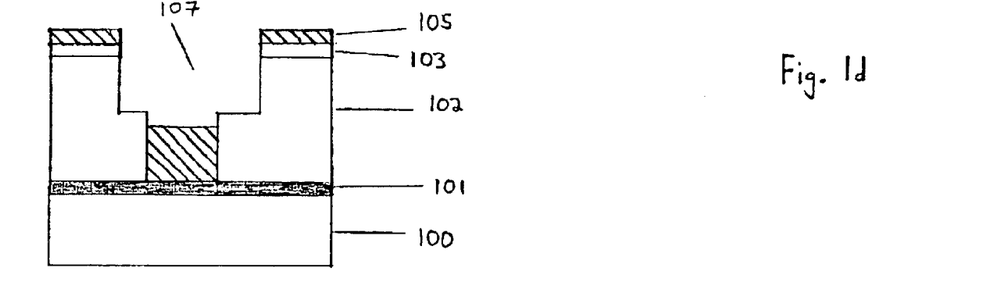

The portion of inorganic hardmask layer, 103, uncovered by the etch of sacrificial fill layer, 105, is typically etched with an anisotropic fluorocarbon based plasma to uncover a portion of organic intermetal dielectric layer, 102. The portion of organic intermetal dielectric layer, 102, uncovered by the etch of hardmask layer, 103, is anisotropically etched with an oxygen based plasma to form line opening, 107, as depicted in FIG. 1d. The photoresist layer, 106, is also stripped by the oxygen based plasma during the etch of organic dielectric layer, 102.

The remaining sacrificial fill material, 105, must be stripped from via opening, 104, and from the surface of hardmask layer, 103, before via opening, 104, and line opening, 107, are filled with conductor. However, conventional organic sacrificial fill materials cannot be easily stripped without damaging organic intermetal dielectric layer, 102, or its adhesion to adjacent layers, and degrading critical dimensions of the interconnect pattern.

What is needed is a dual damascene process which incorporates organic dielectric intermetal layers and is not subject to the drawbacks of previous methods utilizing conventional organic sacrificial fill materials.

SUMMARY OF THE INVENTION

Dual damascene methods are presented in which developer resistant sacrificial inorganic dielectrics temporarily cover and fill openings in organic intermetal dielectric layers. Advantageously, the sacrificial inorganic dielectrics are selectively etched without damaging the organic intermetal layers. In one embodiment of the present invention, a via opening is formed in an organic intermetal dielectric layer. The via opening is filled with a sacrificial inorganic dielectric. A line opening is formed in the sacrificial inorganic dielectric and the organic intermetal dielectric layer. The line opening is formed substantially aligned with the via opening. The sacrificial inorganic dielectric is removed. The via opening and line opening are filled with a conducting material.

In a second embodiment of the present invention, a line opening is formed in an organic intermetal dielectric layer. The line opening is filled with a sacrificial inorganic dielectric. A via opening is formed in the sacrificial inorganic dielectric and the organic intermetal dielectric layer. The via opening is formed substantially aligned with the line opening. The sacrificial inorganic dielectric is removed. The via opening and line opening are filled with a conducting material.

The sacrificial inorganic dielectrics are typically etched with fluorocarbon based plasmas and stripped with a buffered oxide etch. In contrast, the organic intermetal dielectric layers and the organic photoresists are typically etched or stripped with an oxygen based plasma or with a reducing hydrogen based plasma such as an $NH_3$ or $N_2+H_2$ based plasma.

The sacrificial inorganic dielectrics provide a flat surface onto which a thin uniform layer of photoresist is deposited. Photoresist layers may be stripped without damaging organic dielectric layers covered by sacrificial inorganic dielectrics, facilitating photoresist rework. The sacrificial inorganic dielectrics are etched without eroding photoresist patterns, thereby preserving critical dimensions. The sacrificial inorganic dielectrics are etched during inorganic hardmask layer and inorganic etchstop layer etches. Etching steps are thereby eliminated, compared to damascene processes utilizing conventional organic sacrificial fills.

DETAILED DESCRIPTION

The methods of the present invention relate to the fabrication of conducting vias and conducting lines for integrated circuits in semiconductor devices. More particularly, the methods of the present invention relate to the use of sacrificial inorganic dielectrics in dual damascene methods utilizing low dielectric constant organic intermetal dielectric layers. "Sacrificial inorganic dielectrics" denotes herein inorganic dielectrics deposited during a dual damascene process and subsequently substantially removed. The sacrificial inorganic dielectrics temporarily overlie and protect materials vulnerable to damage during the dual damascene process, and provide flat surfaces onto which photoresist layers are deposited.

Sacrificial inorganic dielectrics are advantageously employed when organic dielectrics are used in line levels, via levels, or both line and via levels in integrated circuits. In a first example of the methods of the present invention, a "via first" dual damascene process is used to fabricate conducting vias and conducting lines in a stack of dielectric layers, two of which are organic intermetal dielectric layers separated by an inorganic etchstop layer. Vias are formed in one of the organic intermetal dielectric layers, and lines are formed in the other.

Figure 2A:
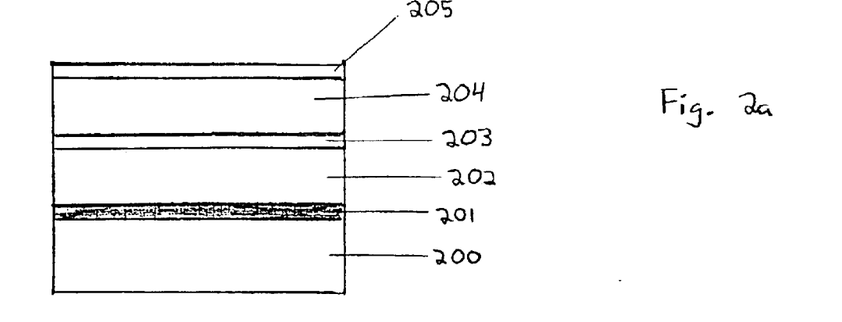
FIG. 2a-2h illustrate the process flow of "via first" dual damascene processes utilizing organic intermetal dielectric layers and sacrificial inorganic dielectrics.

In FIG. 2a, a diffusion barrier, 201, is deposited on a substrate, 200. The thickness of diffusion barrier, 201, typically ranges from about 75 nanometers to about 150 nanometers. Possible substrates include, but are not limited to, semiconductor wafers, metal interconnect layers in integrated circuits, and previously deposited dielectric layers. An interconnect layer typically includes several layers such as etchstop layers, intermetal dielectric layers, and hardrnask layers. The diffusion barrier, 201, prevents conducting material, deposited subsequently, from migrating into the substrate. The diffusion barrier, 201, is typically silicon nitride deposited by chemical vapor deposition (CVD). Other dielectric materials for diffusion barriers and methods for their deposition may also be used in the present invention.

A first organic intermetal dielectric layer, 202, is deposited on the diffusion barrier, 201. The thickness of first organic intermetal dielectric layer, 202, is made about equal to the height of a conducting via. Organic intermetal dielectric layers used in the methods of the present invention may be formed from organic dielectrics including but not limited to polyimides, polytetrafluoroethylene, parylenes, fluorinated and non fluorinated poly(arylene ethers), for example the poly(arylene ether) available under the tradename FLARE™ from Honeywell Inc., the polymeric material obtained from the phenyl-ethynylated aromatic monomer provided by Dow Chemical Company under the tradename SiLK™, fluorinated amorphous carbon, and mixtures thereof. Organic dielectrics may be deposited, for example, by CVD, PECVD, spray coating, dip coating, and spin coating. Other methods for depositing organic dielectrics may also be used in the present invention.

An etchstop layer, 203, is then deposited on the first organic intermetal dielectric layer, 202. The etchstop layer, 203, is typically silicon oxide deposited by CVD, but may be other dielectric material and may be deposited by other methods. The thickness of etchstop layer, 203, typically ranges from about 75 nanometers to about 150 nanometers.

A second organic intermetal dielectric layer, 204, of thickness about equal to the height of a conducting line, is deposited on the etchstop layer, 203. A hardmask layer, 205, is deposited on second organic intermetal dielectric layer, 204. The thickness of hardmask layer, 205, typically ranges from about 75 nanometers to about 250 nanometers. The hardmask layer, 205, is typically silicon oxide or silicon oxynitride deposited by CVD. Other dielectric materials and other deposition methods may be used to form hardmask layer, 205.

The thickness of the organic intermetal dielectric layers, 202 and 204, depends upon the particular metal interconnect level, and typically ranges from about 0.4 microns to about 2 microns. In some integrated circuit designs, the thickness of the organic intermetal dielectric layers in the top metal interconnect level can exceed 2 microns.

Next, a via opening, 207, is formed in hardmask layer, 205, second organic intermetal dielectric layer, 204, etchstop layer, 203, and first organic intermetal dielectric layer, 202. In the present invention, via openings and line openings are typically formed by anisotropically etching the stack of dielectric layers. Inorganic dielectric layers used as diffusion barriers, etchstops, intermetal dielectric layers, and hardmasks are typically selectively etched with fluorocarbon based plasmas in commercially available etching apparatus. Fluorocarbon based plasmas typically etch inorganic materials at a much faster rate than they etch organic materials. Organic intermetal dielectric layers are typically selectively etched with oxygen or hydrogen based plasmas in commercially available etching apparatus. In contrast to fluorocarbon based plasmas, oxygen and hydrogen based plasmas typically etch organic materials at a much faster rate than they etch inorganic materials. Other methods may be used in the present invention to etch dielectric layers.

Figure 2B:
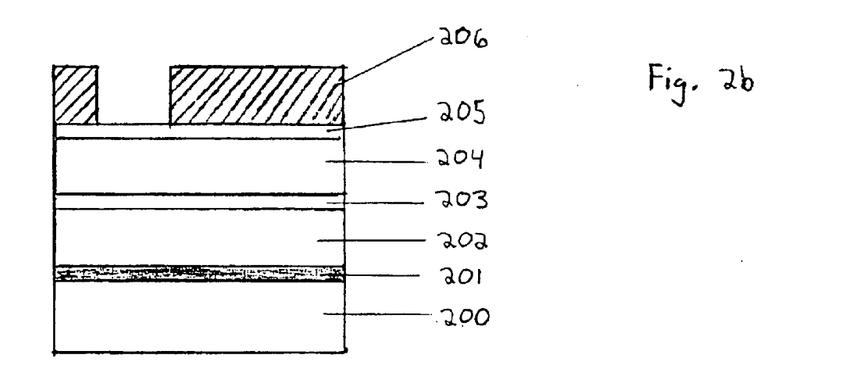
Figure 2C:
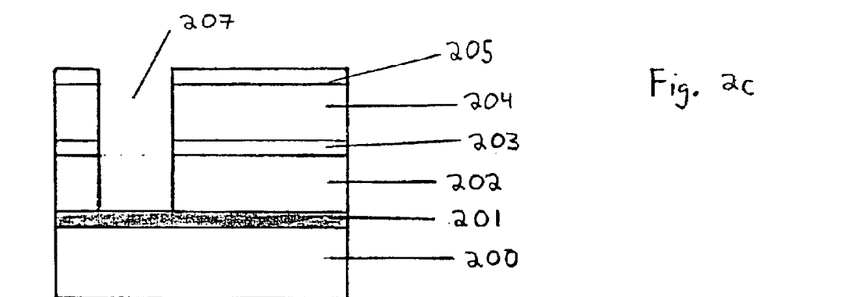

The process of forming via opening, 207, is depicted in FIGS. 2b-2c. As depicted in FIG. 2b, a photoresist layer, 206, is deposited on hardmask layer, 205, baked, patterned with a mask defining the desired via opening, and developed. Conventional photoresists may be used in the methods of the present invention. Typically, photoresists are applied by spin coating, cured by baking, patterned photolithographically, and developed by exposure to a developer solution typically containing 2.5% tetramethylammoniumhydroxide. Photoresists may be subsequently removed by exposure to oxygen or hydrogen based plasmas or to organic solvents. Other methods for applying, curing, patterning, developing, and stripping photoresists may be used in the methods of the present invention.

The portion of the hardmask layer, 205, not covered by the developed photoresist, 206, and corresponding to the desired via opening, is then typically etched with an anisotropic fluorocarbon based plasma to uncover second organic intermetal dielectric layer, 204. Typically, second organic intermetal dielectric layer, 204 is not etched by the fluorocarbon based plasma.

The portion of the second organic intermetal dielectric layer, 204, uncovered by the hardmask etch is typically etched with an anisotropic oxygen or hydrogen based plasma to uncover etchstop layer, 203. Typically, etchstop layer, 203, is not etched by the oxygen or hydrogen based plasma. Consequently, the oxygen or hydrogen based plasma etch is stopped by the etchstop layer, 203. The photoresist layer, 206, is also stripped by the oxygen or hydrogen based plasma etch of second organic intermetal dielectric layer, 204.

The portion of etchstop layer, 203, uncovered by the etch of second organic intermetal dielectric layer, 204, is typically etched with an anisotropic fluorocarbon based plasma to uncover first organic intermetal dielectric layer, 202. Typically, first organic intermetal dielectric layer, 202, is not etched by the fluorocarbon based plasma.

The portion of first organic intermetal dielectric layer, 202, uncovered by the etch of etchstop layer, 203, is etched with an anisotropic oxygen or hydrogen based plasma to uncover diffusion barrier, 201, and thereby complete via opening, 207, as depicted in FIG. 2c. The diffusion barrier, 201, is typically not etched by the oxygen or hydrogen based plasma used to etch first organic dielectric layer, 202.

The via opening, 207, is filled with sacrificial inorganic dielectric, 208. Inorganic dielectrics used in the methods of the present invention as sacrificial inorganic dielectrics include but are not limited to spin-on glasses based on silicates, organosiloxanes such as methylsiloxane, phenylsiloxane, methylphenylsiloxane, methylsilsesquioxane, methylphenylsilsesquioxane, perhydrosilazanes, hydridosiloxanes, and organohydridosiloxanes such as organohydridosiloxanes described by the general formula $(H_{0.4-1.0}SiO_{1.5-1.8})_n$ $(R_{0.4-1.0}SiO_{1.5-1.8})_m$ wherein the sum of n and m is from about 8 to about 5000, and mixtures thereof. The sacrificial inorganic dielectric may incorporate an ultraviolet light absorbing dye. Sacrificial inorganic dielectrics are typically deposited by spin coating. Other methods such as spray coating and dip coating are alternatively used.

Figure 2D:
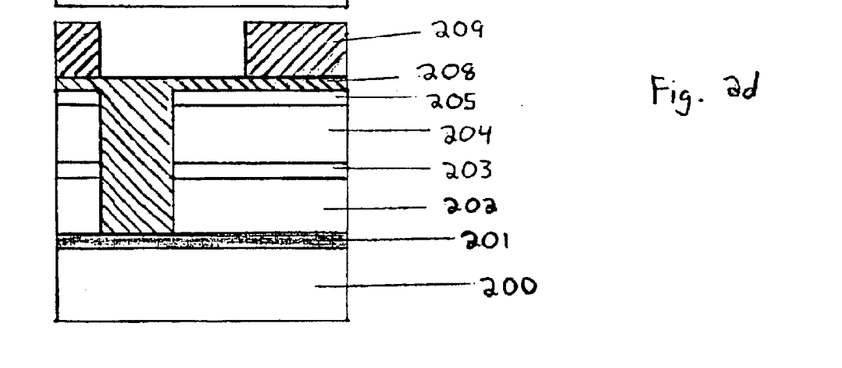

As illustrated in FIG. 2d, sacrificial inorganic dielectric, 208, is deposited in the via opening, 207, and on the surface of the hardmask layer, 205. Typically, sacrificial inorganic dielectric 208 is a methylsiloxane based glass deposited in via opening, 207, and on hardmask layer, 205, by spin coating. The methylsiloxane based glass is baked at a sufficient temperature and for a sufficient time to make it resistant to the photoresist developer TMAH, but not for so long a time or at so high a temperature to induce the glass to fully cross link. Typically, the methylsiloxane based glass is baked for several periods of about 30 to about 60 seconds each at several temperatures in a sequence ranging from about 80° C. to about 350° C. As a result of the baking, the methylsiloxane based glass is resistant to TMAH photoresist developers, but easily stripped by buffered oxide etches. The sacrificial inorganic dielectric layers are intrinsically resistant to etching by oxygen based plasmas and hydrogen based plasmas.

In one embodiment, sacrificial inorganic dielectric, 208, is deposited as a double layer including a first layer of methylsiloxane deposited in via opening, 207, and on the surface of hardmask layer, 205, and a second layer of silicate deposited on the first layer of methylsiloxane.

The sacrificial inorganic dielectric, 208, plugs the via opening, 207, in the organic dielectric layers. The inorganic dielectric via plug and the inorganic dielectric layer on the hardmask layer, 205, together provide a substantially flat surface on which photoresist may be deposited to a uniform thickness. A thin, uniform thickness of photoresist is advantageous during photoresist patterning, development, and stripping.

If via opening, 207, were not plugged by sacrificial inorganic dielectric, 208, it would be necessary to make photoresist layer, 206, sufficiently thick to insure that via opening, 207, was filled. Photoresist layer, 206, would consequently vary in thickness and the surface of photoresist layer, 206, would not be flat. In addition, if the sacrificial inorganic dielectric, 208, absorbs ultraviolet light, it will protect organic intermetal dielectric layers, 202 and 204, from damage due to exposure to ultraviolet light during photoresist patterning, and also act as an antireflection layer to prevent optical interference patterns from distorting the pattern in photoresist layer, 206.

Also advantageously, the sacrificial inorganic dielectric plug of via opening, 207, prevents first organic intermetal dielectric layer, 202, and second organic intermetal dielectric layer, 204, from being damaged during photoresist stripping. Often, photoresist patterns are inadvertently applied misaligned with respect to the substrate. The misaligned photoresist patterns must be reworked: stripped, reapplied, patterned, and developed. The vulnerability of organic intermetal dielectric layers to damage during the photoresist stripping process complicates such photoresist rework. Sacrificial inorganic dielectric, 208, covers and protects portions of the organic intermetal dielectric layers during photoresist rework. Critical dimensions in the interconnect pattern are thereby preserved through subsequent photolithographic and etching processes.

Although sacrificial inorganic dielectric 208 is intrinsically resistant to etching by oxygen based plasmas, exposure to conventional high temperature oxygen plasmas during photoresist rework may damage sacrificial inorganic dielectric 208. For example, methyl groups in a sacrificial methylsiloxane layer may be oxidized by an oxygen based plasma. Consequently, during photoresist rework, photoresist is preferably stripped from sacrificial inorganic dielectric 208 with a low temperature oxygen based plasma, a reducing hydrogen based plasma, or a solvent.

Figure 2E:
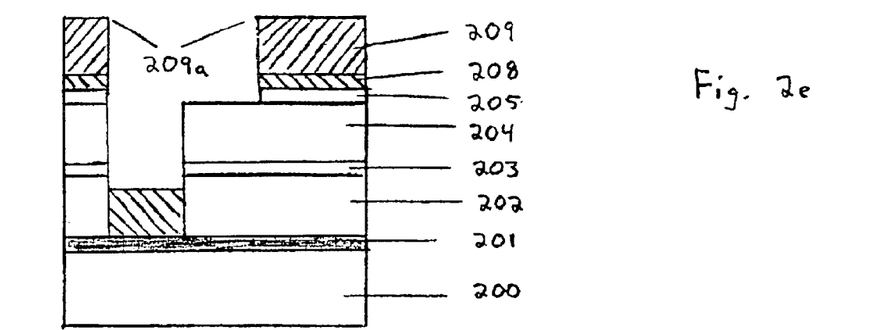
Figure 2F:
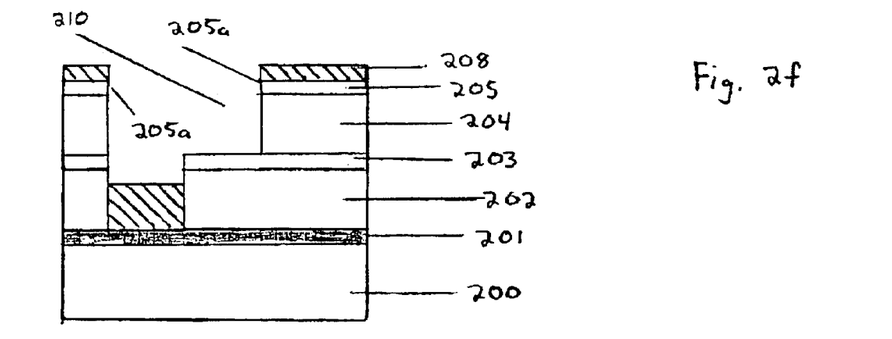

Next, a line opening, 210, is formed in sacrificial inorganic dielectric layer, 208, hard mask layer, 205, and second organic intermetal dielectric layer, 204. This process is depicted in FIGS. 2d-2f. As depicted in FIG. 2d, a photoresist layer, 209, is deposited on the surface of sacrificial inorganic dielectric, 208, cured, photolithographically patterned with a mask defining the desired line opening, and developed. The desired line opening is substantially aligned with the via opening previously formed.

As illustrated in FIG. 2e, the portion of the sacrificial inorganic dielectric, 208, not covered by the photoresist is typically etched with an anisotropic fluorocarbon based plasma. The portion of hardmask layer, 205, uncovered by the etch of the sacrificial inorganic dielectric, 208, is also etched by the anisotropic fluorocarbon based plasma. Preferably, the sacrificial inorganic dielectric, 208, is etched to a depth greater than the desired depth of the conducting line opening to be etched subsequently. The level to which the sacrificial inorganic dielectric, 208, is etched is typically controlled by controlling the duration of the etch. Typically, the fluorocarbon based plasma etch of sacrificial inorganic dielectric, 208, and hardmask layer, 205, does not etch second organic intermetal dielectric layer, 204.

Advantageously, sacrificial inorganic dielectric, 208, and hardmask layer, 205, are etched with the same fluorocarbon based plasma, thus saving a process step in comparison to a process utilizing an organic sacrificial fill. Also, the edges, 209a, of photoresist layer, 209, are not eroded by the fluorocarbon based plasma etch. The critical dimension of the line width is thereby preserved.

The portion of second organic intermetal dielectric layer, 204, uncovered by the etch of sacrificial inorganic dielectric, 208, and hardmask layer, 205, is typically etched with an anisotropic oxygen or hydrogen based plasma to form line opening, 210, as depicted in FIG. 2f. The photoresist layer, 209, is also stripped by the oxygen or hydrogen based plasma. The oxygen or hydrogen based plasma does not etch the sacrificial inorganic dielectric, 208, or the etchstop layer, 203. The etchstop layer prevents the oxygen or hydrogen based plasma from etching organic intermetal dielectric layer 202.

Although inorganic hardmask layer, 205, is resistant to oxygen plasmas, the edges, 205a, of the hardmask layer can be eroded by exposure to an oxygen based plasma during the etch of second organic intermetal dielectric layer, 204. The sacrificial inorganic dielectric, 208, on hardmask layer, 205, prevents the edges of the hardmask layer, 205a, from being rounded by the oxygen or hydrogen based plasma etch, and thereby preserves the critical dimension of the line width. Rounding of the hardmask edges can lead to broadening of conducting line widths and to short circuits between closely spaced conducting lines.

The remaining sacrificial inorganic dielectric, 208, is selectively removed with a buffered oxide etch, for example a standard hydrofluoric acid/water mixture.

These stripping methods typically strip the sacrificial inorganic dielectrics used in the methods of the present invention at a rate greater than about eighty times the rate at which they strip inorganic materials such as silicon oxynitride and silicon oxide used in etchstops, hardmasks, and other dielectric layers. Moreover, buffered oxide etches typically do not damage organic dielectric materials.

Figure 2G:
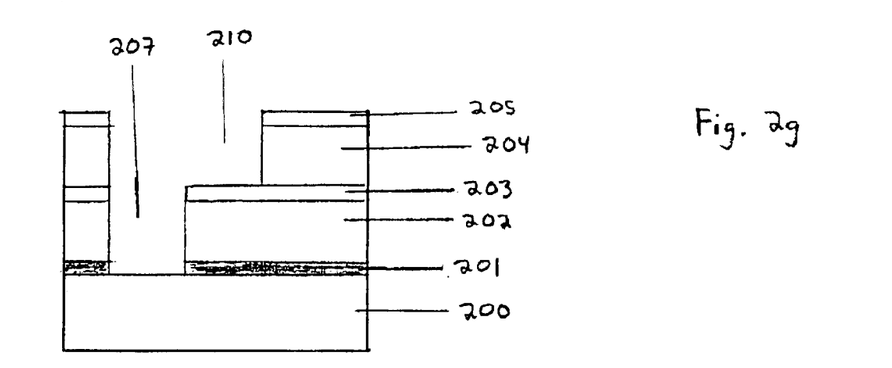

Consequently, sacrificial inorganic dielectric, 208, is selectively removed without damaging organic intermetal dielectric layer, 202, and organic intermetal dielectric layer, 204. The diffusion barrier, 201, uncovered by the removal of the sacrificial inorganic dielectric, 208, is etched with an anisotropic fluorocarbon based plasma to uncover the substrate, 200, as shown in FIG. 2g.

Figure 2H:
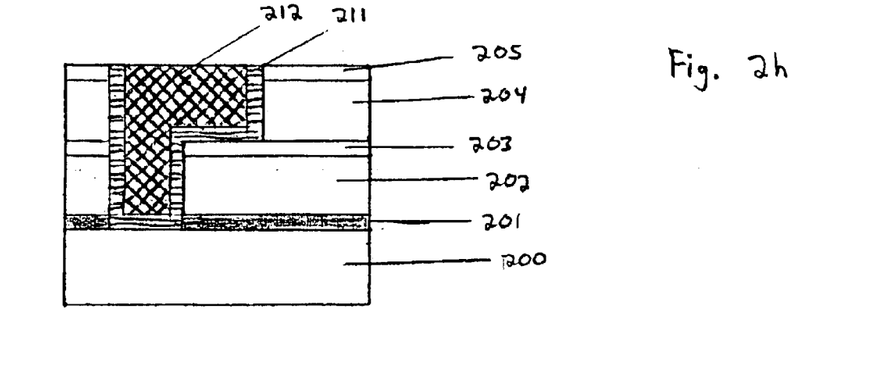

As shown in FIG. 2h, a conducting diffusion barrier, 211, is deposited on the surfaces of the via opening, 207, and the line opening, 210. Electrically conducting barriers to metal diffusion are typically formed from layers of tantalum nitride by PVD methods. Other conducting diffusion barriers and methods for their deposition may also be used in the present invention.

To complete the metallization process, a conducting material, 212, is deposited in the via opening, 207, and in the line opening, 210. In the present invention conducting lines and conducting vias are formed from conductors including but not limited to aluminum, copper, tungsten, and mixtures thereof. Typically, the conductor is copper. Conductors are deposited, for example, by chemical vapor deposition, plasma enhanced chemical vapor deposition, sputtering, and electroplating. Other methods for depositing conductors may also be used.

Finally, chemical and mechanical polishing methods known in the art are used to polish back conductors, 211 and 212, to define and planarize the surface of the conducting line.

In a second example of the methods of the present invention, a "via first" dual damascene process is used to fabricate conducting vias and conducting lines in a stack of dielectric layers, one of which is an organic intermetal dielectric layer, and one of which is an inorganic intermetal dielectric layer. Lines are formed in the organic intermetal dielectric layer, and vias are formed in the inorganic intermetal dielectric layer. Inorganic intermetal dielectric layers used in the methods of the present invention may be formed from inorganic dielectrics including but not limited to silicon oxide, fluorinated silicate glass, and organohydridosiloxanes such as organohydridositoxanes described by the general formula $(H_{0.4-1.0}SiO_{1.5-1.8})_n (R_{0.4-1.0}SiO_{1.5.-1.8})_m$ wherein the sum of n and m is from about 8 to about 5000. Inorganic intermetal dielectric layers may be deposited, for example, by CVD, PECVD, dip coating, spray coating, and spin coating.

The stack of dielectric layers used in this example differs from the stack of the previous example, depicted in FIG. 2a, by the substitution of an inorganic intermetal dielectric layer for first organic intermetal dielectric layer, 202. Also, in this example, etchstop, 203, is not present in the stack of dielectric layers. The inorganic intermetal dielectric layer substituted for first organic intermetal dielectric layer, 202, is typically of thickness about equal to the height of a conducting via.

The inorganic intermetal dielectric layer substituted for first organic intermetal dielectric layer, 202, is typically etched with a fluorocarbon based plasma, rather than with an oxygen or hydrogen based plasma as used with organic intermetal dielectric layers. The process flow for this example is otherwise essentially the same as the process flow for the previous example, in which two organic intermetal dielectric layers are separated by an etchstop layer.

In a third example of the methods of the present invention, a "via first" dual damascene process is used to fabricate conducting lines and conducting vias in a stack of dielectric layers, one of which is an organic intermetal dielectric layer. Lines and vias are formed in the organic intermetal dielectric layer. This stack of dielectric layers differs from the stack of the first example, depicted in FIG. 2a, by the absence of etchstop layer, 203, and by the absence of second organic intermetal dielectric layer, 204. Referring to FIG. 2a, a diffusion barrier, 201, is deposited on a substrate, 200. A first organic intermetal dielectric layer, 202, is deposited on diffusion barrier, 201. The thickness of first organic intermetal dielectric layer, 202, is made about equal to the sum of the height of a conducting via and the height of a conducting line. In this example, etchstop layer, 203, and second organic intermetal dielectric layer, 204, depicted in FIGS. 2a-2h, are not deposited. Instead, hardmask layer, 205, is deposited on first organic intermetal dielectric layer, 202.

As depicted in FIG. 2f, in the first example, the depth of the line opening formed by the oxygen or hydrogen based plasma etch of second organic intermetal dielectric layer, 204, is determined by the position of the etchstop layer, 203. In this third example, the depth of the line opening formed by the oxygen or hydrogen based plasma etch of the organic intermetal dielectric layer is determined by controlling the duration of the etch, rather than by the presence of an etchstop. Otherwise, the process flow for this example is essentially the same as that for the first example, in which two organic dielectric layers were separated by an etchstop.

Figure 3A:
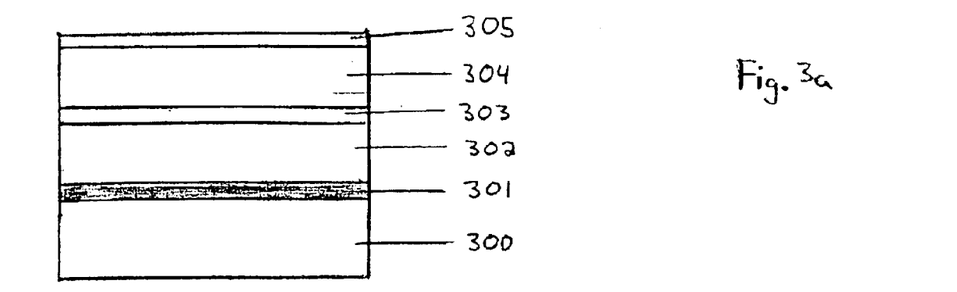
FIGS. 3a-3i illustrate the process flow of "line first" dual damascene processes utilizing organic intermetal dielectric layers and sacrificial inorganic dielectrics.

In a fourth example of the methods of the present invention, a "line first" dual damascene process is used to fabricate conducting vias and conducting lines in a stack of dielectric layers, two of which are organic intermetal dielectric layers separated by an inorganic etchstop layer. Vias are formed in one of the organic intermetal dielectric layers, and lines are formed in the other. In FIG. 3a, a diffusion barrier, 301, is deposited on a substrate, 300. A first organic intermetal dielectric layer, 302, is deposited on the diffusion barrier, 301. The thickness of first organic intermetal dielectric layer, 302, is made about equal to the height of a conducting via. An etchstop layer, 303, is then deposited on the first organic intermetal dielectric layer 302. A second organic intermetal dielectric layer, 304, of thickness about equal to the height of a conducting line, is deposited on the etchstop layer, 303. A hardmask layer, 305, is deposited on second organic intermetal dielectric layer, 304.

Figure 3B:
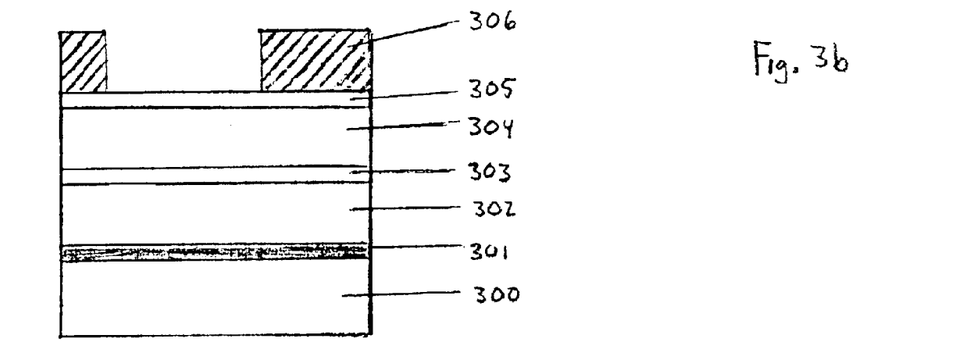
Figure 3C:
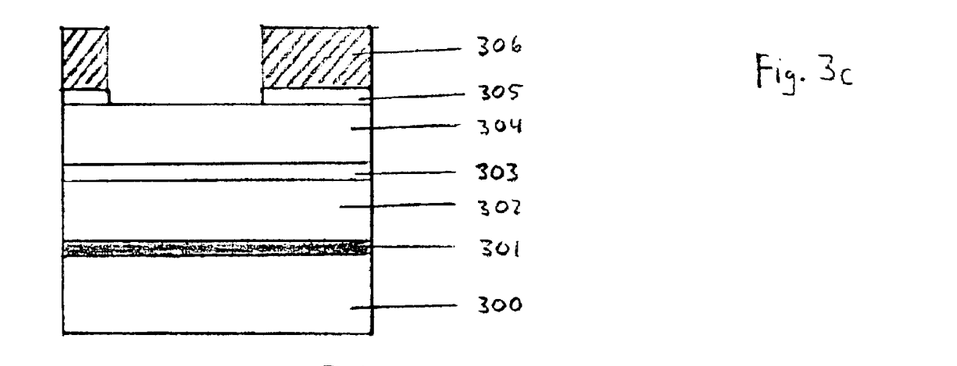

Next, a line opening is formed in hardmask layer, 305, and second organic intermetal dielectric layer, 304. As depicted in FIG. 3b, a photoresist layer, 306, is deposited on hardmask layer, 305, baked, patterned photolithographically with a mask defining the desired line opening, and developed. As depicted in FIG. 3c, the portion of the hardmask layer, 305, not covered by the developed photoresist, 306, and defining the desired line, is typically etched with an anisotropic fluorocarbon based plasma to uncover second organic intermetal dielectric layer, 304. Typically, second organic intermetal dielectric layer, 304, is not etched by the fluorocarbon based plasma.

Figure 3D:
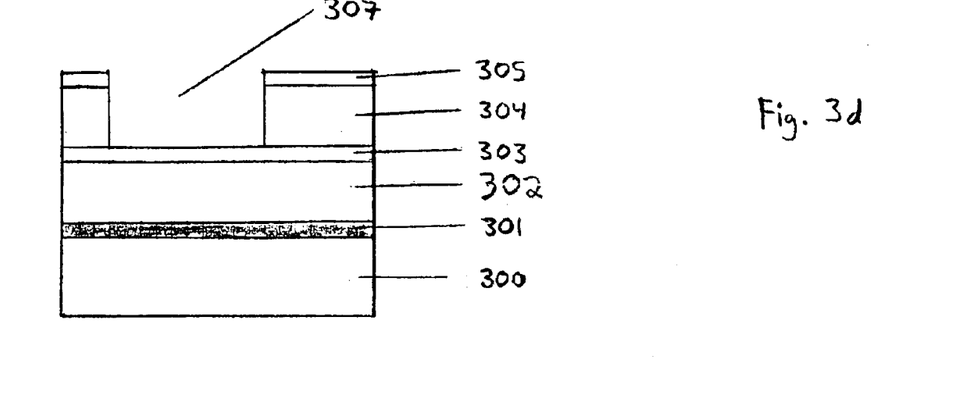

The portion of the second organic intermetal dielectric layer, 304, uncovered by the hardmask etch is typically etched with an anisotropic oxygen or hydrogen based plasma to uncover etchstop layer, 303, and thereby complete line opening, 307, as depicted in FIG. 3d. Typically, etchstop layer, 303, is not etched by the oxygen or hydrogen based plasma. Consequently, the oxygen or hydrogen based plasma etch is stopped by the etchstop layer, 303. The photoresist layer, 306, is also stripped by the oxygen or hydrogen based plasma.

Figure 3E:
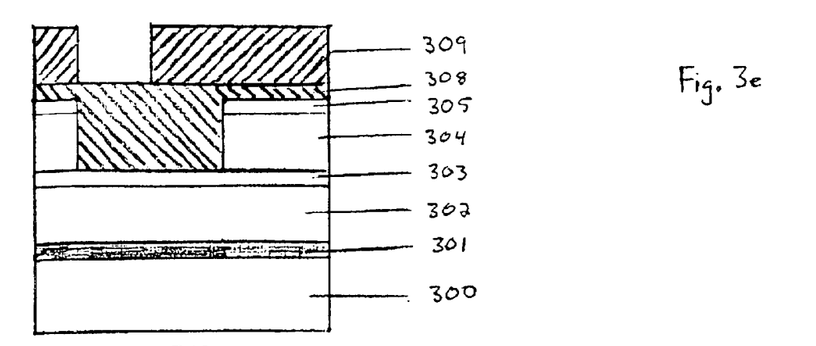

The line opening, 307, is filled with sacrificial inorganic dielectric, 308. As illustrated in FIG. 3e, sacrificial inorganic dielectric, 308, is deposited in the line opening, 307, and on the surface of the hardmask layer, 305. As in the three examples previously described, the sacrificial inorganic dielectric is typically a methylsiloxane based glass deposited in line opening, 307, and on hardmask layer, 305, by spin coating, and baked at a sufficient temperature and for a sufficient time to make it resistant to the photoresist developer TMAH. As in the previous embodiments, the sacrificial inorganic dielectric, 308, provides a substantially flat surface on which photoresist may be deposited to a uniform thickness, and prevents second organic intermetal dielectric layer, 304, from being damaged during photoresist stripping.

Figure 3F:
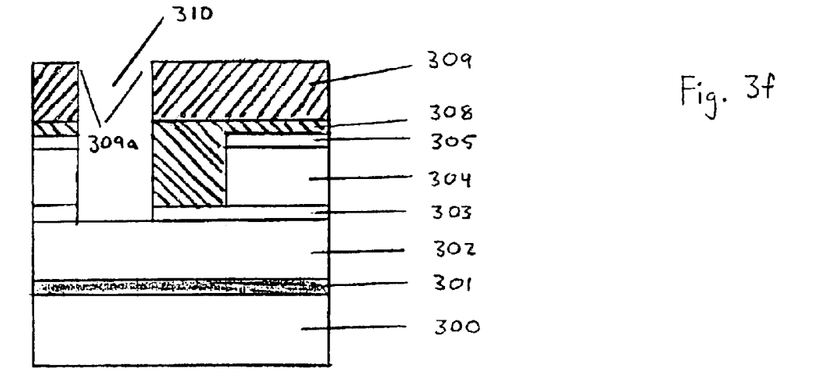
Figure 3G:
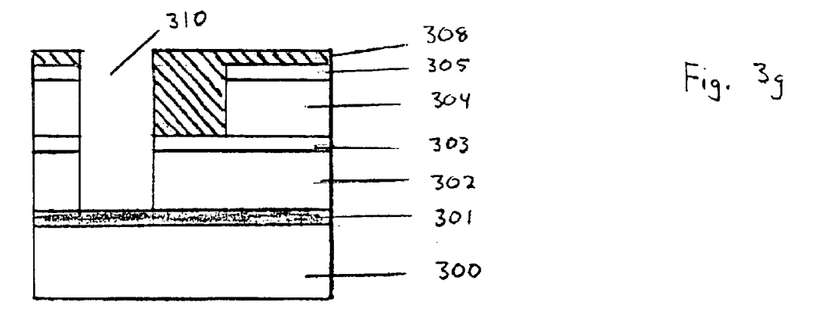

Next, a via opening is formed in sacrificial inorganic dielectric, 308, etchstop layer, 303, and first organic intermetal dielectric layer, 302. This process is depicted in FIGS. 3e-3g. As depicted in FIG. 3e, a photoresist layer, 309, is deposited on the surface of sacrificial inorganic dielectric, 308, cured, photolithographically patterned with a mask defining the desired via opening, and developed. The desired via opening is substantially aligned with the line opening previously formed.

As illustrated in FIG. 3f, the portion of the sacrificial inorganic dielectric, 308, not covered by the photoresist is typically etched with an anisotropic fluorocarbon based plasma. The portion of etchstop layer, 303, uncovered by the etch of the sacrificial inorganic dielectric, 308, is also etched by the anisotropic fluorocarbon based plasma to uncover first organic intermetal dielectric layer, 302. Typically, the fluorocarbon based plasma etch of sacrificial inorganic dielectric, 308, and etchstop layer, 303, does not etch the organic intermetal dielectric layers. Advantageously, the edges 309a of photoresist layer, 309, are not eroded by the fluorocarbon based plasma etch. The critical dimension of the via width is thereby preserved.

As illustrated in FIG. 3g, the portion of first organic intermetal dielectric layer, 302, uncovered by the anisotropic etch of sacrificial inorganic dielectric, 308, and etchstop layer, 303, is typically etched with an anisotropic oxygen or hydrogen based plasma to uncover diffusion barrier, 301, and thereby complete via opening, 310. The photoresist layer, 306, is also stripped by the oxygen or hydrogen based plasma.

Figure 3H:
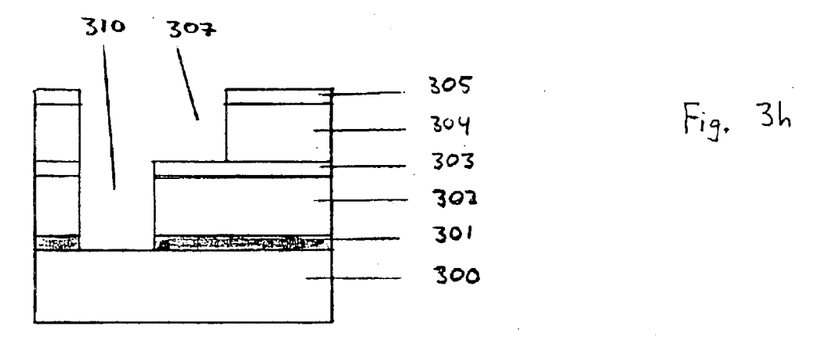

The remaining sacrificial inorganic dielectric, 308, is typically selectively removed with a buffered oxide etch to reopen line opening, 307. The buffered oxide etch does not damage organic intermetal dielectric layer, 302, and organic intermetal dielectric layer, 304. The diffusion barrier, 301, is etched with an anisotropic fluorocarbon based plasma to uncover the substrate, 300, as shown in FIG. 3h.

Figure 3I:
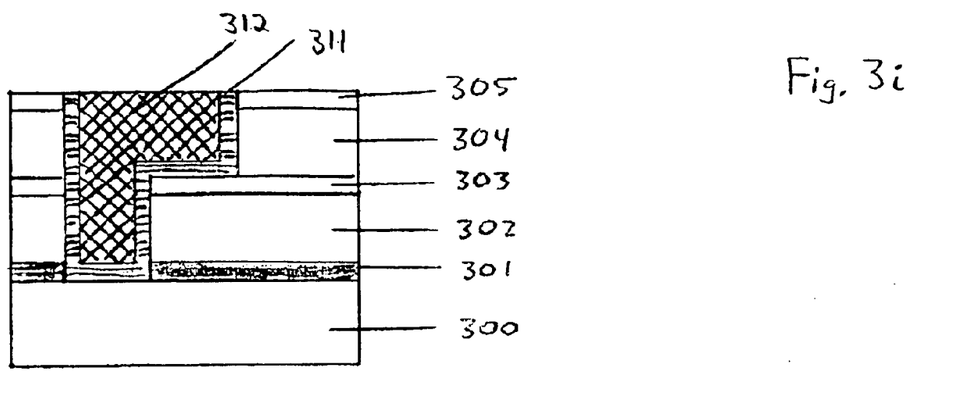

As shown in FIG. 3i, a conducting diffusion barrier, 311, is deposited on the surfaces of the line opening, 307, and of the via opening, 310. The conducting diffusion barrier, 311, is typically tantalum nitride. A conducting material, 312, is deposited in the line opening, 307, and in the via opening, 310. The conducting material is typically copper.

Finally, chemical and mechanical polishing methods known in the art are used to polish back conductors, 311 and 312, to define and planarize the surface of the conducting line.

In a fifth example of the methods of the present invention, a "line first" dual damascene process is used to fabricate conducting lines and conducting vias in a stack of dielectric layers, one of which is an organic intermetal dielectric layer. Lines and vias are formed in the organic intermetal dielectric layer. This stack of dielectric layers differs from the stack of the previous (fourth) example, depicted in FIG. 3a, by the absence of etchstop layer, 303, and by the absence of second organic intermetal dielectric layer, 304. Referring to FIG. 3a, a diffusion barrier, 301, is deposited on a substrate, 300. A first organic intermetal dielectric layer, 302, is deposited on diffusion barrier, 301. The thickness of first organic intermetal dielectric layer, 302, is made about equal to the sum of the height of a conducting via and the height of a conducting line. In this example, etchstop layer, 303, and second organic intermetal dielectric layer, 304, depicted in FIGS. 3a-3i, are not deposited. Instead, hardmask layer, 305, is deposited on first organic intermetal dielectric layer, 302.

As depicted in FIG. 3d, in the previous (fourth) example, the depth of the line opening formed by the oxygen or hydrogen based plasma etch of second organic intermetal dielectric layer, 304, is determined by the position of etchstop layer, 303. In this fifth example, the depth of the line opening formed by the oxygen or hydrogen based plasma etch of the organic intermetal dielectric layer is controlled by controlling the duration of the etch, rather than by the presence of an etchstop. Otherwise, the process flow for this example is essentially the same as that for the fourth example, in which two organic dielectric layers were separated by an etchstop.

The embodiments of this invention described above are illustrative and not limiting. Though the preceding description referred to particular substrates, dielectrics, conductors, stacks, deposition methods, and etching methods, alternative embodiments of this invention include various other substrates, conductors, stacks, deposition methods, and etching methods. Such alternatives include, for example, a "line first" process in a stack of dielectric layers in which the top dielectric layer is an organic intermetal dielectric and the bottom layer is an inorganic intermetal dielectric layer. Various other adaptations and combinations of features of the embodiments disclosed are within the scope of the invention as defined by the following claims.

We claim:

1. A method of making conducting vias and conducting lines on a substrate comprising:
    depositing a stack having a top surface on a substrate, wherein the stack comprises a first organic intermetal dielectric layer, an etchstop layer applied to the first organic intermetal dielectric layer, a second organic intermetal dielectric layer, and a hardrnask layer, wherein the hardmask layer comprises a material comprising silicon oxynitride or silicon oxide;
    forming a via opening in said stack;
    depositing a sacrificial inorganic dielectric in the via opening, wherein the sacrificial inorganic dielectric substantially fills the via opening and substantially covers the top surface of the stack;
    depositing a photoresist material on the sacrificial inorganic dielectric; developing the photoresist material;
    forming a line opening in the stack and the sacrificial inorganic dielectric, said line opening substantially aligned with said via opening;
    selectively removing the sacrificial inorganic dielectric; and
    filling the via opening and the line opening with conducting material.

2. The method of claim 1 wherein said sacrificial inorganic dielectric comprises methylsiloxanes, phenylsiloxanes, methylphenylsiloxanes, methylsilsesquioxanes, methylphenylsilsesquioxanes, silicates, perhydrosilazanes, hydridosiloxanes or organohydridosiloxanes described by the general formula $(H_{0.4-1.0}SiO_{1.5-1.8})_n(R_{0.4-1.0}SiO_{1.5-1.8})_m$ wherein the sum of n and m is from about 8 to about 5000, or mixtures thereof.

3. The method of claim 1 wherein said sacrificial inorganic dielectric is a methylsiloxane.

4. The method of claim 1, wherein either the first or second organic intermetal dielectric layer comprises an organic dielectric that comprises polyimides, polytetrafluoroethylene, parylenes, fluorinated and non fluorinated poly(arylene ethers), polymeric material obtained from phenyl-ethynylated aromatic monomers, fluorinated amorphous carbon, or mixtures thereof.

5. The method of claim 1 wherein said stack further comprises a diffusion barrier layer between said substrate and said first organic intermetal dielectric layer.

6. The method of claim 5 wherein said diffusion barrier layer comprises silicon nitride.

7. The method of claim 1 wherein said sacrificial inorganic dielectric is selectively removed with a buffered oxide etch.

8. The method of claim 1 wherein said substrate comprises semiconductor wafers, dielectric layers, or metal interconnect layers in integrated circuits.

9. The method of claim 1 wherein said via openings and said line openings are formed by etching with an oxygen based plasma and with a fluorocarbon based plasma.

10. The method of claim 1 wherein depositing a stack comprises depositing a stack having a top surface on a substrate, wherein the stack comprises a diffusion barrier layer, an inorganic intermetal dielectric layer, an etchstop layer applied to the first inorganic intermetal dielectric layer, a second organic intermetal dielectric layer, and a hardmask layer, wherein the hardmask layer comprises a material comprising silicon oxynitride or silicon oxide.

11. The method of claim 10 wherein said diffusion barrier layer comprises silicon nitride.

12. The method of claim 10 wherein said inorganic intermetal dielectric layer comprises a material that comprises silicon oxide, fluorinated silicate glass, or organohydridosiloxanes described by the general formula $(H_{0.4-1.0}SiO_{1.5-1.8})_n(R_{0.4-1.0}SiO_{1.5-1.8})_m$ wherein the sum of n and m is from about 8 to about 5000, or mixtures thereof.

13. The method of claim 1 wherein said conducting material comprises aluminum, copper, tungsten, or mixtures thereof.

14. The method of claim 13 wherein said conducting material further comprises a conducting diffusion barrier material.

15. A method of making conducting vias and conducting lines on a substrate comprising:

depositing a stack having a top surface on a substrate, wherein the stack comprises a first organic intermetal dielectric layer, an etchstop layer applied to the first organic intermetal dielectric layer, a second organic intermetal dielectric layer, and a hardmask layer, wherein the hardmask layer comprises a material comprising silicon oxynitride or silicon oxide;

forming a line opening in said stack;

depositing a sacrificial inorganic dielectric in the line opening, wherein the sacrificial inorganic dielectric substantially fills the line opening and substantially covers the top surface of the stack;

depositing a photoresist material on the sacrificial inorganic dielectric;

developing the photoresist material;

forming a via opening in the stack and the sacrificial inorganic dielectric;

selectively removing the sacrificial inorganic dielectric; and filling the via opening and the line opening with conducting material.

16. The method of claim 15 wherein said sacrificial inorganic dielectric comprises methylsiloxanes, phenylsiloxanes, methylphenylsiloxanes, methylsilsesquioxanes, methylphenylsilsesquioxanes, silicates, perhydrosilazanes, hydridosiloxanes or organohydridosiloxanes described by the general formula $(H_{0.4-1.0}SiO_{1.5-1.8})_n(R_{0.4-1.0}SiO_{1.5-1.8})_m$ wherein the sum of n and in is from about 8 to about 5000, or mixtures thereof.

17. The method of claim 15 wherein said sacrificial inorganic dielectric is a methylsiloxane.

18. The method of claim 15, wherein wherein either the first or second organic intermetal comprises an organic dielectric that comprises polyimides, polytetrafluoroethylene, parylenes, fluorinated and non fluorinated poly(arylene ethers), polymeric material obtained from phenyl-ethynylated aromatic monomers, fluorinated amorphous carbon, or mixtures thereof.

19. The method of claim 15, wherein the etchstop layer comprises a material comprising silicon oxide.

20. The method of claim 15, wherein the second organic intermetal dielectric layer comprises an organic dielectric that comprises polyimides, polytetrafluoroethylene, parylenes, fluorinated and non fluorinated poly(arylene ethers), polymeric material obtained from phenyl-ethynylated aromatic monomers, fluorinated amorphous carbon, or mixtures thereof.

21. The method of claim 15 wherein said sacrificial inorganic dielectric is selectively removed with a buffered oxide etch.

22. The method of claim 15 wherein said substrate comprises semiconductor wafers, dielectric layers, or metal interconnect layers in integrated circuits.

23. The method of claim 15 wherein said via openings and said line openings are formed by etching with an oxygen based plasma and with a fluorocarbon based plasma.

24. The method of claim 15 wherein said stack further comprises a diffusion barrier layer between said substrate and said first organic intermetal dielectric layer.

25. The method of claim 24 wherein said diffusion barrier layer comprises silicon nitride.

26. The method of claim 15 wherein said conducting material comprises aluminum, copper, tungsten, or mixtures thereof.

27. The method of claim 26 wherein said conducting material further comprises a conducting diffusion barrier material.

* * * * *